United States Patent
Hung et al.

(10) Patent No.: US 9,467,156 B2
(45) Date of Patent: Oct. 11, 2016

(54) FREQUENCY SYNTHESIZING MODULE AND RELATED FREQUENCY GAIN DETERMINING METHOD

(71) Applicant: MEDIATEK INC., Hsin-Chu (TW)

(72) Inventors: Chao-Ching Hung, Changhua County (TW); Yu-Li Hsueh, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/848,348

(22) Filed: Sep. 9, 2015

(65) Prior Publication Data
US 2016/0156361 A1    Jun. 2, 2016

Related U.S. Application Data

(60) Provisional application No. 62/086,306, filed on Dec. 2, 2014.

(51) Int. Cl.
| | |
|---|---|
| H03L 7/16 | (2006.01) |
| H03L 7/089 | (2006.01) |
| H03L 7/099 | (2006.01) |

(52) U.S. Cl.
CPC .............. *H03L 7/16* (2013.01); *H03L 7/0891* (2013.01); *H03L 7/0991* (2013.01)

(58) Field of Classification Search
CPC ..... H03L 7/0891; H03L 7/0991; H03L 7/16; H03L 7/18

USPC .............. 327/105, 107, 113, 114, 156, 159; 331/17
See application file for complete search history.

(56) References Cited

U.S. PATENT DOCUMENTS

| | | | | |
|---|---|---|---|---|
| 5,933,058 A | * | 8/1999 | Pinto | H03L 7/099 327/157 |
| 8,461,933 B2 | | 6/2013 | Cho | |
| 2005/0046491 A1 | * | 3/2005 | Smith | H03L 7/1976 331/25 |
| 2015/0146835 A1 | * | 5/2015 | Gauthier | H04L 7/0331 375/376 |

* cited by examiner

*Primary Examiner* — William Hernandez
(74) *Attorney, Agent, or Firm* — Winston Hsu; Scott Margo

(57) ABSTRACT

A frequency synthesizing module includes an operating circuit, for generating a control voltage according to a reference signal and a feedback signal; a controllable oscillating circuit, configured for generating an oscillating signal according to the control voltage and a first control signal, comprising a first oscillating circuit with a first frequency gain, and a second oscillating circuit with a second frequency gain; a feedback circuit, for generating the feedback signal according to the oscillating signal and a second control signal; a control circuit, for generating the first control signal and the second control signal; wherein the control circuit adjusts the first control signal by a first value and adjusts the second control signal by a second value to estimate the first frequency gain of the first oscillating circuit; wherein the first value is proportional to the second value.

22 Claims, 4 Drawing Sheets

FREQUENCY SYNTHESIZING MODULE AND RELATED FREQUENCY GAIN DETERMINING METHOD

CROSS REFERENCE TO RELATED APPLICATIONS

This application claims the benefit of U.S. Provisional Application No. 62/086,306 filed on Dec. 2, 2014 the contents of which are incorporated herein in their entirety.

BACKGROUND

The present invention relates to a frequency synthesizing module and a frequency gain determining method, and more particularly, to a frequency synthesizing module and a frequency gain determining method thereof capable of accurately determining the frequency gain of a controllable oscillator in a short time.

Conventionally, a two-point modulator (TPM) is a low-complexity implementation of a transmitter of a transceiver in mobile radio systems. The two-point modulator includes a phase-locked loop (PLL) circuit, a low-pass modulating path, and a high-pass modulating path. Input modulation data is fed to the phase-locked loop circuit via the low-pass modulating path and the high-pass modulating path. Generally, the low-pass modulating path is connected to the feedback divider of the phase-locked loop circuit, and the high-pass modulating path is connected to the voltage-controlled oscillator (VCO) of the phase-locked loop circuit.

Ideally, the two-point modulator has an all-pass response from the input modulation data to the output signal of the voltage-controlled oscillator, so that the phase-locked loop circuit has a transmission response which is independent of frequency. However, as the gain of the voltage-controlled oscillator is a variable with respect to the frequency, the voltage-controlled oscillator may induce a gain mismatch when the frequency band of the transmitted output signal is changed. In other words, the frequency response of the two-point modulator deteriorates when the two-point modulator is used to transmit a multi-band output signal. Therefore, providing an efficient way to detect and calibrate the gain mismatch in the two-point modulator is a significant concern in the mobile radio field.

SUMMARY

In order to solve the above problems, the present invention provides a frequency synthesizing module capable of determining a frequency gain of a controllable oscillator with a high accuracy in a short time and related frequency gain determining method.

The present invention discloses a frequency synthesizing module. The frequency synthesizing module includes an operating circuit, for generating a control voltage according to a reference signal and a feedback signal; a controllable oscillating circuit, configured for generating an oscillating signal according to the control voltage and a first control signal, comprising a first oscillating circuit with a first frequency gain, and a second oscillating circuit with a second frequency gain; a feedback circuit, for generating the feedback signal according to the oscillating signal and a second control signal; a control circuit, for generating the first control signal and the second control signal; wherein the control circuit adjusts the first control signal by a first value and adjusts the second control signal by a second value to estimate the first frequency gain of the first oscillating circuit; wherein the first value is proportional to the second value.

The present invention further discloses a frequency gain determining method applied to a controllable oscillating circuit in a frequency synthesizing module, wherein the controllable oscillating circuit is configured for generating an oscillating signal according to a control voltage and a first control signal. The frequency gain determining method includes adjusting the first control signal corresponding to a first frequency gain and a second control signal corresponding to a second frequency gain, to make the control voltage of the controllable oscillating circuit equal a reference voltage, wherein the second frequency gain is from an output frequency of the oscillating signal to the control voltage; adjusting the first control signal by a first value; adjusting the second control signal by a second value to make the control voltage equal the reference voltage; and obtaining the first frequency gain according to the first value, the second value and a reference signal of the frequency synthesizing module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
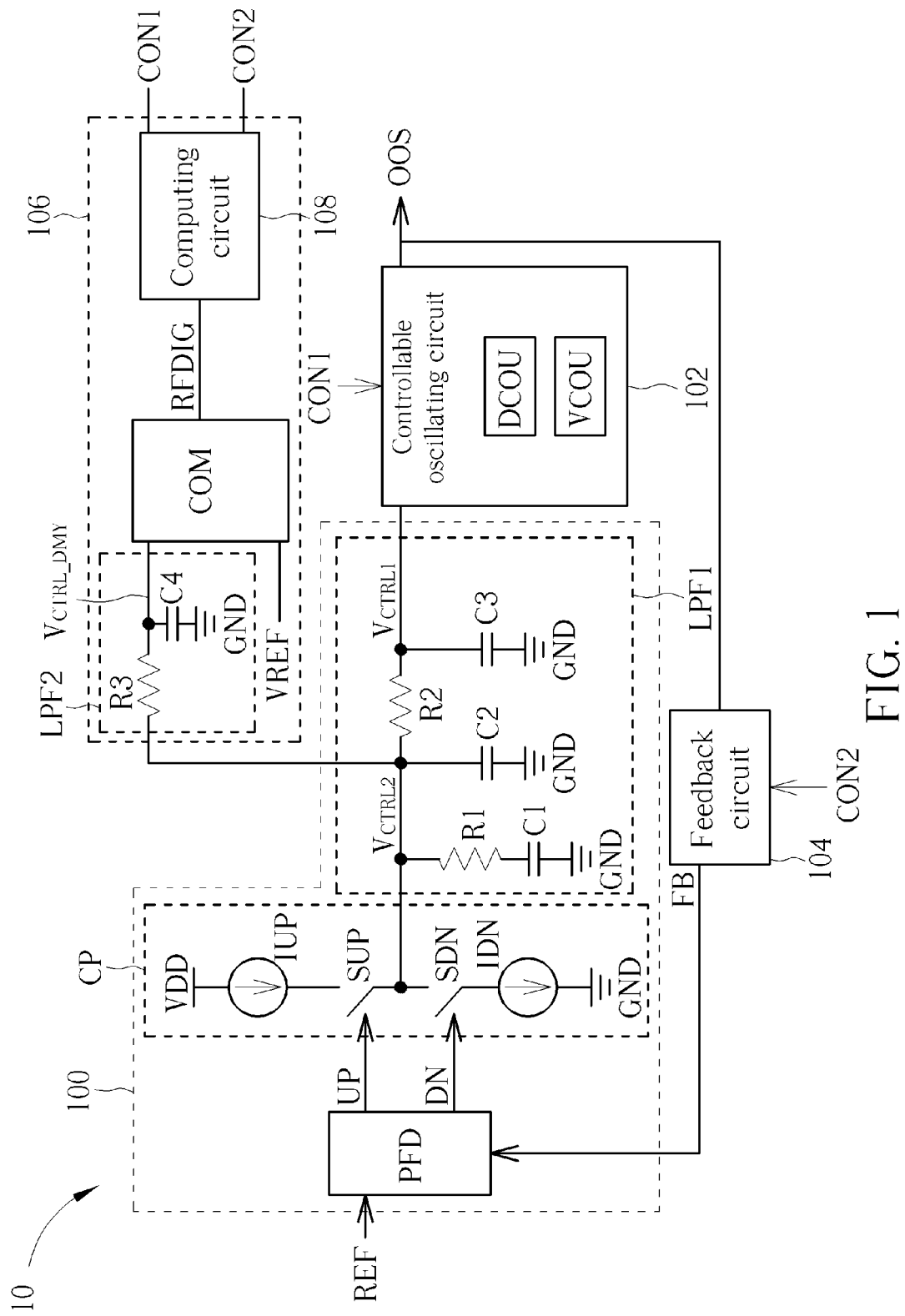
FIG. 1 is a schematic diagram of a frequency synthesizing module according to an example of the present invention.

Please refer to FIG. 1, which is a schematic diagram of a frequency synthesizing module 10 according to an example of the present invention. The frequency synthesizing module 10 may be a two point modulation (TPM) phase-locked-loop-based frequency synthesizer in electronic components (e.g. an integrated circuit, IC) of an electronic product, such as a mobile phone, a tablet, a digital camera, and a smart television, and is not limited herein. As shown in FIG. 1, the frequency synthesizing module 10 includes an operating circuit 100, a controllable oscillating circuit 102, a feedback circuit 104 and a control circuit 106. The operating circuit 100 is utilized for generating a control voltage $V_{CTRL1}$ according to a reference signal REF and a feedback oscillating signal FB. The operating circuit 100 includes a phase frequency detector PFD, a charge pump CP and a low pass filter LPF1. The low pass filter LPF1 includes resistors R1, R2 and capacitors C1-C3. The low pass filter LPF1 generates the control voltage $V_{CTRL1}$ at an output terminal of the low pass filter LPF1. The charge pump CP includes current sources IUP, IDN and switches SUP, SDN. The charge pump CP generates a control voltage $V_{CTRL2}$. In FIG. 1, the control voltage $V_{CTRL1}$ and the control voltage $V_{CTRL2}$ are voltages at different terminals of the operating circuit 100 and have different voltage levels. In another example, the operating circuit 100 may output the control voltage $V_{CTRL1}$ to the control circuit 106 rather than output the control voltage $V_{CTRL2}$ to the control circuit 106. The controllable oscillating circuit 102 includes a digitally-controlled oscillating circuit DCOU and a voltage-controlled oscillating circuit VCOU. The digitally-controlled oscillating circuit DCOU has a frequency gain $K_{DCO}$, and the voltage-controlled oscillating circuit VCOU has a frequency gain $K_{VCO}$. The controllable oscillating circuit 102 generates an oscillating signal OOS according to the control voltage $V_{CTRL1}$ and a control signal CON1. The feedback circuit 104 includes a frequency divider (not shown in FIG. 1) and is utilized for generating the feedback oscillating signal FB according to the oscillating signal OOS and a control signal CON2. In FIG. 1, the control circuit 106 generates the control signals CON1 and CON2 according to the control voltage $V_{CTRL2}$ of the operating circuit 100. In another example, the control circuit 106 generates the control signals CON1 and CON2 according to the control voltage $V_{CTRL1}$ of the operating circuit 100.

In detail, the phase frequency detector PFD detects a difference Td between the reference signal REF and the feedback oscillating signal FB and accordingly generates up signal UP and down signal DN, to control the charge pump CP to increase or to decrease the control voltage $V_{CTRL1}$ and $V_{CTRL2}$, wherein the difference Td is a time difference in response to the phase difference between the reference clock signal REF and the feedback oscillating signal FB, and high frequency components of the control voltage $V_{CTRL2}$ is filtered out by the low pass filter LPF1. Next, the controllable oscillating circuit 102 generates the oscillating signal OOS according to the control voltage $V_{CTRL1}$ and the control signal CON1. The control signal CON1 generated by the control circuit 106 is utilized for adjusting an output oscillating frequency $F_{OOS}$ of the oscillating signal OOS. In one example, the digitally-controlled oscillating circuit DCOU of the controllable oscillating circuit 102 includes a set of switches respectively coupled to a set of capacitors. The control signal CON1 includes a value $N_{COU}$, which indicates a number of switches of the said set of switches being turned on. And the output oscillating frequency $F_{OOS}$ of the oscillating signal OOS decreases when the value $N_{COU}$ carried by the control signal CON1 increases. The control signal CON2 generated by the control circuit 106 is also utilized for adjusting the output oscillating frequency $F_{OOS}$ of the oscillating signal OOS. The feedback circuit 104 divides the output oscillating frequency $F_{OOS}$ of oscillating signal OOS by a divisor $N_{DIV}$ indicated by the control signal CON2, to generate the feedback oscillating signal FB.

Via the feedback path including the feedback circuit 104, the output oscillating frequency $F_{OOS}$ of the oscillating signal OOS is the product of a reference frequency $F_{REF}$ of the reference signal REF and the divisor $N_{DIV}$ indicated by the control signal CON2. The control signal CON2 generated by the control circuit 106 is utilized for adjusting the output oscillating frequency $F_{OOS}$. In addition, the output oscillating frequency $F_{OOS}$ can be expressed as a sum of a nominated frequency $F_{nom}$, which is the output oscillating frequency $F_{OOS}$ when the control voltage $V_{CTRL1}$ equals 0 and the value $N_{COU}$ also equals 0, a product of the control voltage $V_{CTRL1}$ and the frequency gain $K_{VCO}$, and a product of the value $N_{COU}$ of the control signal CON1 and the frequency gain $K_{DCO}$. That is, the output oscillating frequency $F_{OOS}$ can be expressed as the following equation:

$$F_{OOS}=N_{DIV} \times F_{REF}=F_{nom}+V_{CTRL1} \times K_{VCO}+N_{COU} \times K_{DCO} \qquad (1)$$

As can be seen from the equation (1), the output oscillating frequency $F_{OOS}$ can be adjusted via adjusting the control signals CON1 and CON2 (i.e. the value $N_{COU}$ and the divisor $N_{DIV}$). In one example, the control circuit 106 is implemented by using digital circuits and the control signals CON1 and CON2 are generated sequentially to estimate the frequency gain $K_{DCO}$. In one example, the frequency gain $K_{DCO}$ is designed to be one known value. However, the frequency gain $K_{DCO}$ may deviate from the designed value due to the process variations in the frequency synthesizing module 10. In order to estimate the frequency gain $K_{DCO}$, the control circuit 106 first adjusts the value $N_{COU}$ indicated by the control signal CON1 to be a value $N_{COU1}$ and the divisor $N_{DIV}$ indicated by the control signal CON2 to be a value $N_{DIV1}$, respectively, and thus the adjusting the control voltage $V_{CTRL1}$ is adjusted to a reference voltage $V_{REF}$. The equation of the output oscillating frequency $F_{OOS}$ is as follows:

$$F_{OOS}=N_{DIV1} \times F_{REF}=F_{nom}+V_{REF} \times K_{VCO}+N_{COU} \times K_{DCO} \qquad (2)$$

Next, the control circuit 106 adjusts the control signal CON1 to indicate a value $N_{COU2}$, wherein a difference between the values $N_{COU1}$ and $N_{COU2}$ is a value $\Delta N_{COU}$. At the same time, the control circuit 106 adjusts the control signal CON2 to indicate a divisor $N_{DIV2}$, wherein a difference between the divisors $N_{DIV1}$ and $N_{DIV2}$ is a value $\Delta N_{DIV1}$. The values $\Delta N_{COU}$ and $\Delta N_{DIV1}$ are set to satisfy a criterion that the product of the value $\Delta N_{DIV1}$ and the reference frequency $F_{REF}$ equals the product of the value $\Delta N_{COU1}$ and the designed value of the frequency gain $K_{DCO}$. In one example, the value of the value $\Delta N_{COU}$ is dependent on a bit number of the control signal CON1. For example, if the bit number of the control signal CON1 is 10, the value $\Delta N_{COU}$ can be an integer value between $2^0$ to $(2^{10}-1)$, meaning that the value $\Delta N_{COU}$ can be set as any integer value between 1 and 1023. And since the value $\Delta N_{DIV1}$ is proportional to the value $\Delta N_{COU}$, the value $\Delta N_{DIV1}$ is determined according to the value $\Delta N_{COU}$. The equation of the frequency $F_{OOS}$ is modified to be:

$$F_{OOS} = N_{DIV2} \times F_{REF} = (N_{DIV1} + \Delta N_{DIV1}) \times F_{REF} = \qquad (3)$$
$$F_{nom} + V_{REF} \times K_{VCO} + N_{COU2} \times K_{DCO} =$$
$$F_{nom} + V_{REF} \times K_{VCO} + (N_{COU1} + \Delta N_{COU}) \times K_{DCO}$$

The equation (3) holds when the frequency gain $K_{DCO}$ remains the original designed value. However, under the condition that the frequency gain $K_{DCO}$ deviates from the designed value due to the process variations, the control voltage $V_{CTRL1}$ would be accordingly changed and deviate from the reference voltage $V_{REF}$. A relation between the frequency gain $K_{VCO}$ and the control voltage $V_{CTRL1}$ is a function. In one example, the relation is a quadratic function. The control circuit 106 maintains the control signal CON1 at the value $N_{COU2}=N_{COU1}+\Delta N_{COU}$ and adjusts the control signal CON2 to a value $N_{DIV3}$ to make the control voltage $V_{CTRL1}$ equal the reference voltage $V_{REF}$, wherein a difference between the value $N_{DIV3}$ and $N_{DIV1}$ is a value $\Delta N_{DIV2}$. When the control voltage $V_{CTRL1}$ equals the reference voltage $V_{REF}$, the control circuit 106 acquires the control signal CON2 indicating the divisor to be the value $N_{DIV3}$, which is $N_{DIV1}+\Delta N_{DIV2}$. In such a condition, the equation of the frequency $F_{OOS}$ can be expressed as:

$$F_{OOS} = N_{DIV3} \times F_{REF} = (N_{DIV1} + \Delta N_{DIV2}) \times F_{REF} = \qquad (4)$$

-continued $$F_{nom} + V_{REF} \times K_{VCO} + (N_{COU1} + \Delta N_{COU}) \times K_{DCO}$$

Based on the equations (2) and (4), the frequency gain $K_{DCO}$ can be derived by the following equation:

$$K_{DCO} = \frac{\Delta N_{DIV2} \times F_{REF}}{\Delta N_{COU}} \quad (5)$$

Since $\Delta N_{DIV2}$ and $\Delta N_{COU}$ can be derived from the control signals CON1, CON2 and the reference signal REF is robust, the control circuit 106 can determine the frequency gain $K_{DCO}$ with a high accuracy and accordingly perform calibration processes of the controllable oscillating circuit 102.

According to different applications and designed concepts, the method of realizing the control circuit 106 may be various. In one example, the control circuit 106 includes a low pass filter LPF2, a comparator COM and a computing circuit 108. The low pass filter LPF2 includes a resistor R3 and a capacitor C4 and is utilized for generating a dummy control voltage $V_{CTRL\_DMY}$ which equals the control voltage $V_{CTRL}$. In another example, the low-pass filter LPF2 may be omitted and the control circuit 106 may receive the control voltage $V_{CTRL1}$ as the dummy control voltage $V_{CTRL\_DMY}$. The comparator COM is utilized for comparing the reference voltage VREF and the dummy control voltage $V_{CTRL\_DMY}$ to accordingly generate an indicating signal RFDIG to the computing circuit 108, wherein the indicating signal RFDIG indicates which of the reference voltage VREF and the dummy control voltage $V_{CTRL\_DMY}$ is with the larger value. According to the indicating signal RFDIG, the computing circuit 108 adjusts the control signals CON1 and CON2 to implement the abovementioned process of estimating the frequency gain $K_{DCO}$ of the digitally-controlled oscillating circuit DCOU.

Further, the structure of frequency synthesizing module 10 may be modified according to different applications and design concepts. In an example, the operating circuit 100 shown in FIG. 1 may change to output the control voltage $V_{CTRL1}$ rather the control voltage $V_{CTRL2}$ to the control circuit 106. Under such a condition, the low pass filter LPF2 may be omitted. In another example, the low pass filter LPF1 may be altered. For example, the resistor R2 and the capacitor C3 may be removed from the low pass filter LPF1. In other words, the control voltage $V_{CTRL1}$ equals the control voltage $V_{CTRL2}$ in this example.

Figure 2:
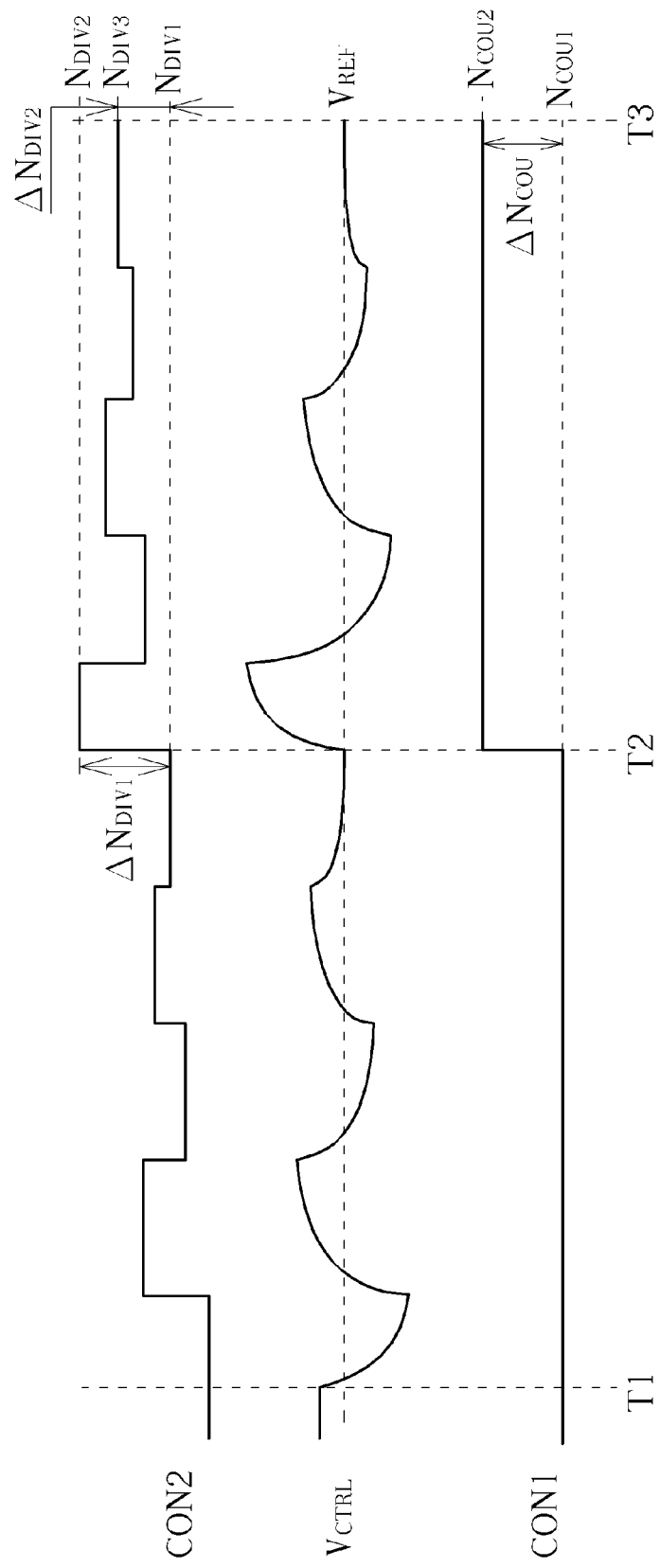
FIG. 2 is a schematic diagram of related signals of the frequency synthesizing module shown in FIG. 1.

Please refer to FIG. 2, which is a schematic diagram of related signals of the frequency synthesizing module 10. At time T1, the frequency synthesizing module 10 starts estimating the frequency gain $K_{DCO}$. The control circuit 106 keeps the control signal CON1 the value $N_{COU1}$ and adjusts the control signal CON2 for adjusting the control voltage $V_{CTRL1}$ (i.e. the dummy control voltage $V_{CTRL\_DMY}$) to the reference voltage $V_{REF}$. At time T2, the control voltage $V_{CTRL1}$ is adjusted to the reference voltage $V_{REF}$ and the control signal CON2 indicates the divisor $N_{DIV1}$. Next, the control circuit 106 adjusts the control signal CON1 to indicate the value $N_{COU2}$ and adjusts the control signal CON2 to indicate the divisor $N_{DIV2}$, wherein the difference between the values $N_{COU1}$ and $N_{COU2}$ is the value $\Delta N_{COU}$ and the difference between the divisors $N_{DIV1}$ and $N_{DIV2}$ is the value $\Delta N_{DIV1}$. The amount of frequency variances of the output frequency $F_{OOS}$ caused by the value $\Delta N_{COU}$ and the value $\Delta N_{DIV1}$ are the same when the frequency gain $K_{DCO}$ remains the designed value.

In FIG. 2, at time T2, the control voltage $V_{CTRL1}$ begins to increase due to the variations of the frequency gain $K_{DCO}$ and the control circuit 106 adjusts the control signal CON2 to make the control voltage $V_{CTRL1}$ equal the reference voltage $V_{REF}$. At time T3, the control voltage $V_{CTRL1}$ equal the reference voltage $V_{REF}$ and the control signal CON2 indicates the divisor NDIV3, wherein the difference between the divisors NDIV3 and NDIV1 is the value $\Delta N_{DIV2}$. Therefore, the frequency gain $K_{DCO}$ can be derived by utilizing the value $\Delta N_{DIV2}$, the value $\Delta N_{COU}$ and the reference frequency $F_{REF}$ according to the equation (5).

In prior art, the frequency gain $K_{DCO}$ may be estimated by counting the frequency changes when adjusting the controllable oscillating circuit and the time for estimating the frequency gain $K_{DCO}$ may significantly increases to meet the requirement of estimating the frequency gain $K_{DCO}$ with higher accuracy. On the other hand, in one example of the present disclosure, as can be seen in FIG. 2, the control circuit 106 estimates the frequency gain $K_{DCO}$ during 10 times of locking the control voltage $V_{CTRL1}$ to the reference voltage $V_{REF}$, meaning that the time for the control circuit 106 to estimate the frequency gain $K_{DCO}$ relates to the time for the control voltage $V_{CTRL1}$ to be back to the reference voltage $V_{REF}$. Thus, the control circuit 106 can estimate the frequency gain $K_{DCO}$ with the higher accuracy in a short time period. The process of estimating the frequency gain $K_{DCO}$ of the controllable oscillating circuit 102 is not limited to be performed in the boot-on process and can be performed during the operations of the frequency synthesizing module 10 since the control circuit 106 can rapidly determine the frequency gain $K_{DCO}$. In addition, the time of the control circuit 106 estimating the frequency gain $K_{DCO}$ can be further improved by applying fast locking techniques to allow the control voltage $V_{CTRL1}$ to rapidly settle to the reference voltage $V_{REF}$.

The frequency synthesizing module 10 of the above example estimates the frequency gain $K_{DCO}$ of the controllable oscillating circuit 102 via keeping the control voltage $V_{CTRL1}$ unchanged when adjusting the control signal CON1 which controls the controllable oscillating circuit 102, so as to eliminate the effect of uncertain factors (e.g. the frequency gain $K_{VCO}$). According to different applications and design concepts, those with ordinary skill in the art may accordingly observe appropriate alternations and modifications. For example, the frequency gain $K_{DCO}$ may change when the frequency band (e.g. the nominated frequency $F_{nom}$) of the controllable oscillating circuit 102 changes. Once the frequency gain $K_{DCO}$ corresponding to a frequency band is acquired, the frequency gain $K_{DCO}$ corresponding to another frequency band can be derived from the acquired frequency gain $K_{DCO}$ according to the ratio between the frequency bands. In an example, the control circuit 106 acquires a frequency gain $K_{DCO}$ when the controllable oscillating circuit 102 operates at a frequency band 2 GHz. When the controllable oscillating circuit 102 operates at another frequency band 4 GHz, the control circuit 106 can estimate that the frequency gain $K_{DCO2}$ corresponding to the frequency band 4 GHz is a product of the frequency gain $K_{DCO1}$ and a cubic of the frequency ratio between 4 GHz and 2 GHz $$\left(\text{i.e. } K_{DCO2} = K_{DCO1} \times \left(\frac{4}{2}\right)^3\right).$$

Figure 3:
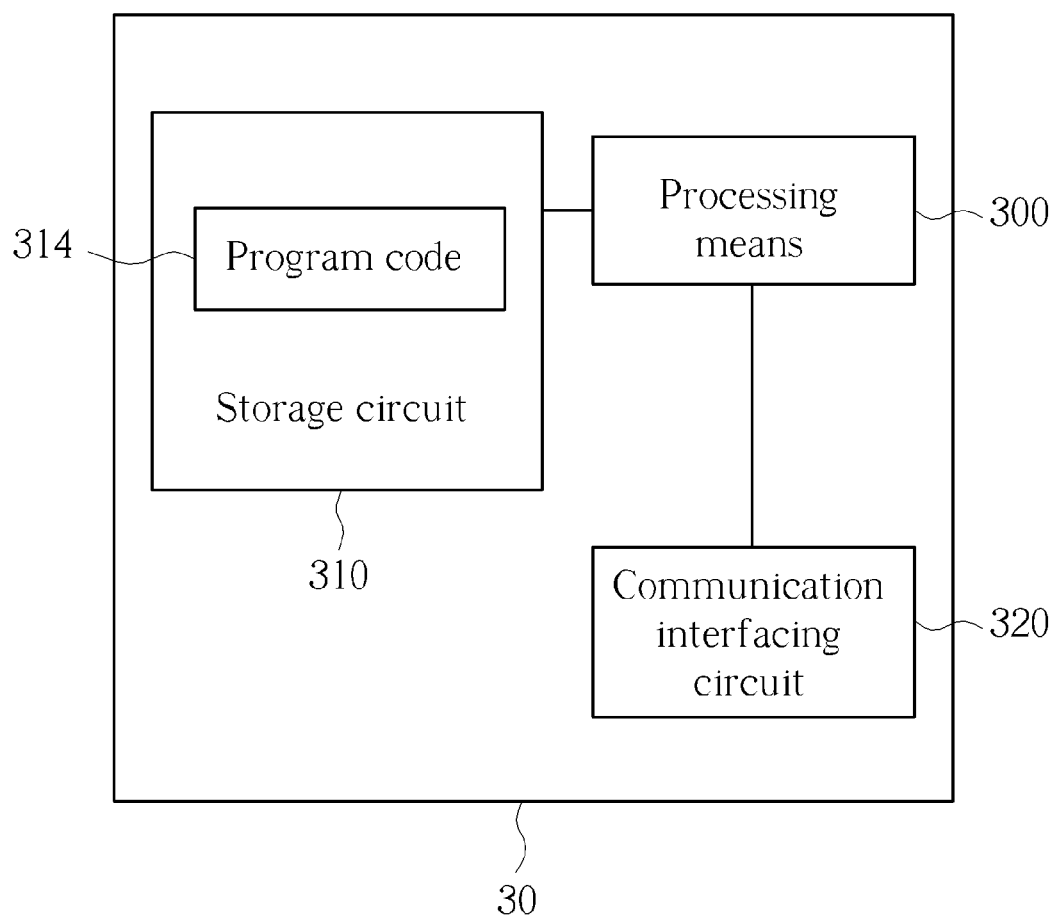
FIG. 3 is a schematic diagram of a computing circuit according to an example of the present invention.

Please refer to FIG. 3, which is a schematic diagram of a computing circuit 30 according to an example of the present invention. The computing circuit 30 can be an example of implementation of the computing circuit 108 shown in FIG. 1. The computing circuit 30 includes a processing means 300, a storage circuit 310 and a communication interfacing circuit 320. The processing means 300 may be a microprocessor or Application Specific Integrated Circuit (ASIC). The storage circuit 310 may be any data storage device that is capable of storing a program code 314, accessed and executed by the processing means 400. Examples of the storage circuit 310 include but are not limited to a subscriber identity module (SIM), read-only memory (ROM), flash memory, random-access memory (RAM), CD-ROM/DVD-ROM, magnetic tape, hard disk and optical data storage device. The communication interfacing circuit 320 is preferably a transceiver and is used to transmit and receive signals (e.g. the indicating signal RFDIG and the control signal CON1 and CON2) according to processing results of the processing means 300.

Figure 4:
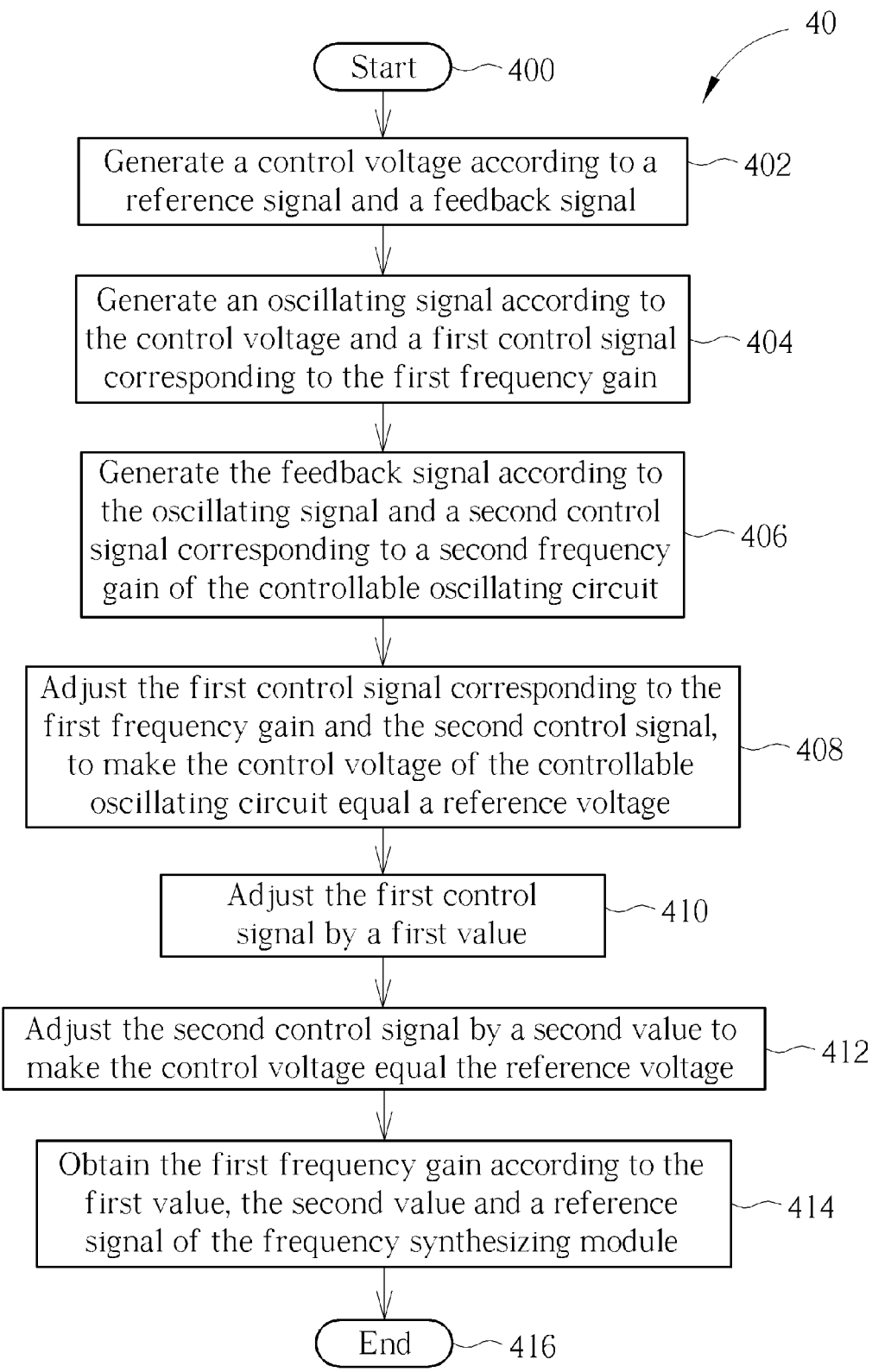
FIG. 4 is a flowchart of an operational process according to an example of the present invention.

The method of the control circuit 106 estimating the frequency gain $K_{DCO}$ can be summarized into an operational process 40 shown in FIG. 4. The operational process 40 is utilized in a frequency synthesizing module for estimating a first frequency gain (e.g. the gain $K_{DCO}$) of a controllable oscillating circuit in the frequency synthesizing module. In one example, the operational process 40 may be compiled into the program code 314. The operational process 40 comprises the following steps:

Step 400: Start.

Step 402: Generate a control voltage according to a reference signal and a feedback signal.

Step 404: Generate an oscillating signal according to the control voltage and a first control signal corresponding to the first frequency gain.

Step 406: Generate the feedback signal according to the oscillating signal and a second control signal corresponding to a second frequency gain of the controllable oscillating circuit.

Step 408: Adjust the first control signal corresponding to the first frequency gain and the second control signal, to make the control voltage of the controllable oscillating circuit equal a reference voltage.

Step 410: Adjust the first control signal by a first value.

Step 412: Adjust the second control signal by a second value to make the control voltage equal the reference voltage.

Step 414: Obtain the first frequency gain according to the first value, the second value and the reference signal of the frequency synthesizing module.

Step 416: End.

According to the operational process 40, an operating circuit of the frequency synthesizing module generates a control voltage according to a reference signal (i.e. a reference frequency) and a feedback signal. Next, a controllable oscillating circuit of the frequency synthesizing module generates an oscillating signal according to the control voltage and a first control signal corresponding to the first frequency gain of the controllable oscillating circuit. The feedback signal is generated by a feedback circuit of the frequency synthesizing module and according to the oscillating signal and a second control signal corresponding to a second frequency gain of the controllable oscillating circuit. In order to estimate the first frequency gain, the frequency synthesizing module adjusts the first control signal corresponding to the first frequency gain and the second control signal, to adjust the control voltage of the controllable oscillating circuit to a reference voltage. Note that, the second frequency gain is the gain from an output frequency of the oscillating signal to the control voltage (e.g. frequency gain $K_{VCO}$). A product of a divisor indicated by the second control signal and a reference frequency equals a sum of a nominated frequency, a product of the control voltage and the second frequency gain, and a product of a first frequency gain and a value indicated by the first control signal (e.g. the equation (1)). After the control voltage is settled to the reference voltage, the frequency synthesizing module adjusts the first control signal by a first value, and adjusts the second control signal by a second value to make the control voltage equal the reference voltage. The frequency synthesizing module acquires the first frequency gain of the controllable oscillating circuit according to the first value, the second value and the reference frequency (e.g. the equation (5)). The detailed operations of the operational process 40 can be referred to the above, and are not narrated herein for brevity.

Please note that, the above mentioned steps of the processes including suggested steps can be realized by means that could be hardware, firmware known as a combination of a hardware device and computer instructions and data that reside as read-only software on the hardware device, or an electronic system. Examples of hardware can include analog, digital and mixed circuits such as microcircuits, microchips, or silicon chips. Examples of the electronic system can include system on chip (SOC), system in package (Sip), computer on module (COM), and the computing circuit 108.

To sum up, the frequency synthesizing module of the above example estimates the first frequency gain of the controllable oscillating circuit via keeping the control voltage of the controllable oscillating circuit unchanged when adjusting the control signals which controls the controllable oscillating circuit, so as to eliminate the effects of uncertain factors. As a result, the frequency synthesizing module acquires the first frequency gain with the high accuracy in the short time period.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency synthesizing module, comprising:
   an operating circuit, for generating a control voltage according to a reference signal and a feedback signal;
   a controllable oscillating circuit, configured for generating an oscillating signal according to the control voltage and a first control signal, comprising:
      a first oscillating circuit with a first frequency gain; and
      a second oscillating circuit with a second frequency gain;
   a feedback circuit, for generating the feedback signal according to the oscillating signal and a second control signal;
   a control circuit, for generating the first control signal and the second control signal;
   wherein the control circuit adjusts the first control signal by a first value and adjusts the second control signal by a second value to estimate the first frequency gain of the first oscillating circuit;
   wherein the first value is proportional to the second value.

2. The frequency synthesizing module of claim 1, wherein the control circuit adjusts the first control signal and the second control signal to make the control voltage equal a reference voltage and estimates the first frequency gain according to the first value, the second value and the reference signal.

3. The frequency synthesizing module of claim 1, wherein a product of a divisor indicated by the second control signal and a reference frequency of the reference signal equals a sum of a nominated frequency, a product of the control voltage and the second frequency gain, and a product of the first frequency gain and a value indicated by the first control signal.

4. The frequency synthesizing module of claim 1, wherein the operating circuit comprising:
a phase frequency detector, for detecting a difference between the reference signal and the feedback signal and generating an up signal and a down signal;
a charge pump CP, for generating a second control voltage according to the up signal and the down signal; and
a low pass filter, for generating a first control voltage according to the second control voltage.

5. The frequency synthesizing module of claim 4, wherein the control voltage is the first control voltage.

6. The frequency synthesizing module of claim 4, wherein the control voltage is the second control voltage.

7. The frequency synthesizing module of claim 4, wherein the control circuit generates the first control signal and the second control signal according to the first control voltage.

8. The frequency synthesizing module of claim 7, wherein the control circuit comprises:
a low pass filter, coupled to the operating circuit for generating a dummy control voltage according to the first control voltage;
a comparator, coupled to the low pass filter and a reference voltage for generating an indication signal; and
a computing circuit, coupled to the comparator for generating the first control signal and the second control signal according to the indication signal.

9. The frequency synthesizing module of claim 1, wherein the control circuit generates the first control signal and the second control signal according to a second control voltage.

10. The frequency synthesizing module of claim 9, wherein the control circuit comprises:
a low pass filter, coupled to the operating circuit for generating a dummy control voltage according to the second control voltage;
a comparator, coupled to the low pass filter and a reference voltage for generating an indication signal; and
a computing circuit, coupled to the comparator for generating the first control signal and the second control signal according to the indication signal.

11. The frequency synthesizing module of claim 9, wherein the control circuit comprises:
a comparator, for generating an indicating signal according to the second control voltage and a reference voltage; and
a computing circuit, coupled to the comparator for generating the first control signal and the second control signal according to the indication signal.

12. The frequency synthesizing module of claim 1, wherein the control circuit calibrates the controllable oscillating circuit according to the first frequency gain.

13. The frequency synthesizing module of claim 1, wherein the first frequency gain corresponds to a first frequency band of the controllable oscillating circuit, a third frequency gain corresponds to a second frequency band of the first oscillating circuit in the controllable oscillating circuit, and the control circuit derives the third frequency gain according to the first frequency gain and a ratio between the second frequency band and the first frequency band.

14. The frequency synthesizing module of claim 13, wherein the third frequency gain is a product of the first frequency gain times the cubic of the ratio.

15. The frequency synthesizing module of claim 1, wherein the frequency synthesizing module is a two point modulation phase-locked-loop-based frequency synthesizer.

16. A frequency gain determining method applied to a frequency synthesizing module, the frequency gain determining method comprising:
generating, by an operating circuit of the frequency synthesizing module, a control voltage according to a reference signal and a feedback signal;
generating, by a controllable oscillating circuit of the frequency synthesizing module, an oscillating signal according to the control voltage and a first control signal corresponding to a first frequency gain of the controllable oscillating circuit;
generating, by a feedback circuit of the frequency synthesizing module, the feedback signal according to the oscillating signal and a second control signal corresponding to a second frequency gain of the controllable oscillating circuit; and
adjusting, by a control circuit, the first control signal by a first value and the second control signal by a second value, to estimate the first frequency gain;
wherein the first value is proportional to the second value.

17. The frequency gain determining method of claim 16, further comprising:
adjusting, by the control circuit, the first control signal and the second control signal to make the control voltage equal a reference voltage; and
estimating, by the control circuit, the first frequency gain according to the first value, the second value and the reference signal.

18. The frequency gain determining method of claim 16, wherein a product of a divisor indicated by the second control signal and a reference frequency of the reference signal equals a sum of a nominated frequency, a product of the control voltage and the second frequency gain, and a product of the first frequency gain and a value indicated by the first control signal.

19. The frequency gain determining method of claim 16, further comprising:
calibrating the controllable oscillating circuit according to the first frequency gain.

20. The frequency gain determining method of claim 16, wherein the first frequency gain corresponds to a first frequency band of the controllable oscillating circuit and the frequency gain determining method further comprises:
deriving a third frequency gain corresponding to a second frequency band of the controllable oscillating circuit according to the first frequency gain and a ratio between the second frequency band and the first frequency band.

21. The frequency gain determining method of claim 20, wherein the third frequency gain is a product of the first frequency gain times the cubic of the ratio.

22. The frequency gain determining method of claim 16, wherein the frequency synthesizing module is a two point modulation phase-locked-loop-based frequency synthesizer.

* * * * *